(12) United States Patent
Ali et al.

(10) Patent No.: US 12,009,632 B2
(45) Date of Patent: Jun. 11, 2024

(54) SEMICONDUCTOR LASER AND PRODUCTION METHOD FOR A SEMICONDUCTOR LASER

(71) Applicant: OSRAM Opto Semiconductors GmbH, Regensburg (DE)

(72) Inventors: Muhammad Ali, Regensburg (DE);
Harald König, Bernhardswald (DE);
Sven Gerhard, Alteglofsheim (DE);
Alfred Lell, Maxhütte-Haidhof (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 594 days.

(21) Appl. No.: 17/284,997

(22) PCT Filed: Oct. 4, 2019

(86) PCT No.: PCT/EP2019/076927
§ 371 (c)(1),
(2) Date: Apr. 13, 2021

(87) PCT Pub. No.: WO2020/078744
PCT Pub. Date: Apr. 23, 2020

(65) Prior Publication Data
US 2021/0391685 A1 Dec. 16, 2021

(30) Foreign Application Priority Data
Oct. 15, 2018 (DE) .................. 10 2018 125 496.2

(51) Int. Cl.
*H01S 5/02* (2006.01)
*H01S 5/02375* (2021.01)
(Continued)

(52) U.S. Cl.
CPC .......... *H01S 5/0202* (2013.01); *H01S 5/0203* (2013.01); *H01S 5/02375* (2021.01);
(Continued)

(58) Field of Classification Search
CPC ...................................................... H01S 5/2202
See application file for complete search history.

(56) References Cited

U.S. PATENT DOCUMENTS

| 4,940,672 A | 7/1990 | Zavracky |
| 6,430,203 B1 | 8/2002 | Yokouchi et al. |
(Continued)

FOREIGN PATENT DOCUMENTS

| CN | 105633795 A | 6/2016 |
| DE | 102011100175 | 11/2012 |
(Continued)

OTHER PUBLICATIONS https://www.rp-photonics.com/gain_guiding.html (Year: 2014).*
(Continued)

*Primary Examiner* — Minsun O Harvey
*Assistant Examiner* — Stephen Sutton Kotter
(74) *Attorney, Agent, or Firm* — MH2 TECHNOLOGY LAW GROUP LLP

(57) ABSTRACT

In one embodiment, the invention relates to a semiconductor laser comprising a semiconductor layer sequence for generating laser radiation. According to the invention, the semiconductor layer sequence has a geometric structuring on a top side. A resonator is located in the semiconductor layer sequence and is delimited by opposing facets, wherein the facets contain optically active resonator end faces. The structuring ends spaced apart from the facets. The resonator end faces are spaced apart from material removals from the semiconductor layer sequence.

17 Claims, 7 Drawing Sheets

(51) Int. Cl.
*H01S 5/028* (2006.01)
*H01S 5/10* (2021.01)
*H01S 5/22* (2006.01)
*H01S 5/343* (2006.01)

(52) U.S. Cl.
CPC .......... *H01S 5/0282* (2013.01); *H01S 5/1017* (2013.01); *H01S 5/22* (2013.01); *H01S 5/34333* (2013.01)

(56) References Cited

U.S. PATENT DOCUMENTS

| | | | |
|---|---|---|---|
| 2008/0089374 A1* | 4/2008 | Eichler | H01S 5/2231 372/45.01 |
| 2008/0273563 A1 | 11/2008 | Schmidt et al. | |
| 2011/0051769 A1* | 3/2011 | Sugai | B82Y 20/00 372/45.011 |
| 2014/0064311 A1 | 3/2014 | Eichler et al. | |
| 2016/0268775 A1* | 9/2016 | Eichler | H01S 5/22 |
| 2017/0357067 A1* | 12/2017 | Ohki | G02B 6/4295 |

FOREIGN PATENT DOCUMENTS

| | | |
|---|---|---|
| DE | 102012112531 | 6/2014 |
| DE | 102013220641 | 4/2015 |
| DE | 102016106495 | 10/2017 |
| JP | H0637404 | 2/1994 |
| JP | H10242570 | 9/1998 |
| JP | 2004140203 A | 5/2004 |
| JP | 2007189075 A | 7/2007 |
| JP | 2008091910 A | 4/2008 |
| JP | 2010021491 | 1/2010 |
| JP | 2010114202 | 5/2010 |
| JP | 2017228772 | 12/2017 |
| WO | 2016129618 | 8/2016 |

OTHER PUBLICATIONS http://www.mt-berlin.com/frames_ao/descriptions/sio2.htm (Year: 2017).*
V. Yu. Davydov et al., Raman studies of acoustical phonons in strained hexagonal GaN/AlGaN superlattices, Abstract (Year: 2001).*
International Search Report and Written Opinion in corresponding International Application No. PCT/EP2019/076927 dated Jan. 16, 2020, 16 pages.
Wu et al., "Thermal Conductivity of Wurtzite Zinc-Oxide from First-Principles Lattice Dynamics—a ComparativeStudy with Gallium Nitride", Scientific Reports, Mar. 1, 2016, vol. 6, No. 22504, 11 pages.
"Ridge Waveguide Ridge Mirror Laser Diode", IBM Technical Disclosure Bulletin, Mar. 1994, vol. 37, No. 3, 1 page.
Japanese Notice of Reason for Rejection in corresponding JP Application No. 2021-518137 dated May 31, 2022, 10 pages.

* cited by examiner

A)

B)

C)

A)

B)

A)

B)

A)

B)

A)

B)

SEMICONDUCTOR LASER AND PRODUCTION METHOD FOR A SEMICONDUCTOR LASER

CROSS-REFERENCE TO RELATED APPLICATIONS

This patent application is a national stage entry from International Application No. PCT/EP2019/076927, filed on Oct. 4, 2019, published as International Publication No. WO 2020/078744 A1 on Apr. 23, 2020, and claims priority under 35 U.S.C. § 119 from German patent application 10 2018 125 496.2, filed Oct. 15, 2018, the entire contents of all of which are incorporated by reference herein.

FIELD

A semiconductor laser is specified. Furthermore, a production method for semiconductor lasers is specified.

BACKGROUND

A problem to be solved is to specify a semiconductor laser which can be operated with high optical power densities.

SUMMARY

This task is solved, inter alia, by a semiconductor laser and by a production method having the features of the independent patent claims. Preferred further developments are the subject of the dependent claims.

The semiconductor laser described herein comprises, in particular, facets which are free of subsequent material removal, such as etching, in regions which are relevant for the laser radiation. Thus, the facets can be generated in high quality by means of breaking.

According to at least one embodiment, the semiconductor laser comprises a semiconductor layer sequence. The semiconductor layer sequence includes one or more active zones for generating laser radiation. A wavelength of maximum intensity of the laser radiation is, for example, in the near ultraviolet spectral region or in the blue spectral region, for example, at a wavelength of at least 340 nm and/or of at most 480 nm or 540 nm. Alternatively, the laser radiation comprises a wavelength of maximum intensity in the green, yellow or red spectral range or also in the near-infrared spectral range.

The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or an arsenide compound semiconductor material such as $Al_nIn_{1-n-m}Ga_mAs$ or such as $Al_nGa_mIn_{1-n-m}As_kP_{1-k}$, wherein in each case $0 \leq n \leq 1$, $0 \leq m \leq 1$ and $n+m \leq 1$ as well as $0 \leq k < 1$. Preferably, $0 < n \leq 0.8$, $0.4 \leq m \leq 1$ as well as $0 \leq k \leq 0.5$ applies to at least one layer or to all layers of the semiconductor layer sequence. In this context, the semiconductor layer sequence may comprise dopants as well as additional components. For simplicity, however, only the essential constituents of the crystal lattice of the semiconductor layer sequence, i.e. Al, As, Ga, In, N or P, are specified, even if these may be partially replaced and/or supplemented by small amounts of additional substances.

Preferably, the semiconductor layer sequence is based on the material system $Al_nIn_{1-n-m}Ga_mN$, AlInGaN for short, and is configured to generate near-ultraviolet radiation or blue light.

According to at least one embodiment, the semiconductor layer sequence comprises at least one geometric structuring on a top side. The geometric structuring is, in particular, a removal of material from the semiconductor layer sequence after the semiconductor layer sequence has been grown. For example, the structuring comprises mesa flanks on the semiconductor layer sequence. However, in a region of the structuring, the semiconductor layer sequence is still partially present. In other words, the semiconductor layer sequence has a finite thickness in the region of the structuring and thus also comprises a top side.

According to at least one embodiment, the semiconductor laser comprises a resonator. The resonator extends completely or predominantly within the semiconductor layer sequence. The resonator is bounded by two preferably opposing facets of the semiconductor layer sequence.

According to at least one embodiment, the facets comprise optically effective resonator end faces. Accordingly, the resonator end faces are such regions of the facets which come into contact with the laser radiation guided in the resonator or which are close to region at which the laser radiation is reflected or through which the laser radiation passes. Close to the laser radiation means in particular close to a ridge waveguide.

According to at least one embodiment, the structuring ends at a distance from at least one of the facets. Preferably, the structuring ends at a distance from both facets. That is, the structuring does not extend to the facet or facets.

According to at least one embodiment, at least one of the resonator end faces or, preferably, both resonator end faces are spaced apart from material removals from the semiconductor layer sequence. Thus, the facets in the region of the resonator end faces are generated exclusively by breaking. Thus, high quality facets are achievable, which comprise only a low defect density and which enable high optical output powers.

The semiconductor laser may be a monomode laser or a multimode laser.

In at least one embodiment, the semiconductor laser comprises a semiconductor layer sequence for generating laser radiation. The semiconductor layer sequence comprises at least one geometric structuring on a top side. A resonator is located in the semiconductor layer sequence and is bounded by two, for example, opposing facets of the semiconductor layer sequence, wherein the facets comprise optically effective resonator end faces. The structuring terminates at a distance from at least one of the facets. At least one of the resonator end faces is spaced apart from material removals from the semiconductor layer sequence, in particular a resonator end face set up for outcoupling.

Laser diodes are core components of applications such as projection applications, illumination applications, or material processing. Due to the high optical output power densities of laser diodes, which are in the range of more than 10 MW per square centimeter, further applications of laser diodes are possible. In comparison, conventional light-emitting diodes, or LEDs, comprise optical power densities in the range of less than 1 kW per square centimeter.

However, due to the very high optical power densities of laser diodes, there is an increased risk of facet damage. To avoid damage or reduce the risk of damage, defect-free facets generated by means of cleaving are required. Without high quality facets, high optical power densities with high reliability cannot be achieved.

Laser diodes with uneven or damaged facet regions at the focus of the laser radiation suffer from increased threshold currents, reduced differential efficiencies, also known as slope efficiency, and lower electro-optical efficiency. In addition, defects or damage to laser facets have a strong impact on a far-field optical field of the laser and can dramatically reduce the yield in the laser diode production process. Furthermore, the long-term stability of laser components is highly dependent on the quality of the laser facets. In the worst case, the laser diode can suffer catastrophical optical damage during operation. Such damage is also referred to as Catastrophic Optical Damage or COD for short.

In the semiconductor laser described here, facets generated via breaking can be produced in high quality so that defects on the facets are minimized. The terms cleaving and breaking are used synonymously here.

In conventional index-guided lasers based on ridge waveguide technology, index guiding is achieved by etched regions in the semiconductor material, so that a ridge waveguide is obtained by removing material from the semiconductor layer sequence. After etching the semiconductor material in the optical mode region, a passivation is applied to these regions on both sides of the ridge waveguide, wherein the passivation comprises a lower refractive index. The breaking or cleaving to create the laser facets passes through these uneven regions on the ridge waveguide and typically results in regions of increased defect density, which have a strong impact on the performance, yield, and stability of the laser.

In particular, in the semiconductor laser described herein, a ridge waveguide near the facets is hammer-shaped when viewed from above, so that a width of the ridge waveguide increases abruptly toward the facets. This applies towards an outcoupling facet and/or towards a reflecting facet. Due to the fact that there are no unevennesses on the semiconductor layer sequence during breaking to generate the facets, the facets can be generated in a region of the resonator end faces with a significantly reduced defect density and with higher quality. In addition, better process control and process stability can be achieved during production and generation of the facets. Furthermore, it is possible to improve the performance data of the semiconductor laser.

In the semiconductor laser described here, material removals at the facets is thus avoided during the production process. Such material removals are, for example, wet chemical or dry chemical etching. That is, in particular, dry chemical etching to create the ridge waveguide or to create mesa flanks is performed along the resonator in shorter areas than in conventional semiconductor lasers. This allows the facets in flat regions of the semiconductor layer sequence to be broken with high quality.

The regions where the facets are generated can be free of coatings or they can be coated. In particular, coatings can be used to achieve matching of a break wave velocity. This allows break waves in the semiconductor material to be guided in a more targeted manner, and more uniform breaking can be achieved. Such coatings are, for example, made of semiconductor materials such as silicon, II-VI semiconductor materials or III-N semiconductor materials, of insulating layers such as silicon oxide, silicon nitride, silicon oxynitride, zinc oxide, ITO or aluminum oxide. Preferably, however, such coatings are made of at least one metal. Material combinations, in particular of metal layers and of semiconductor layers, can also be used.

A flat network of structures on the top side of the semiconductor layer sequence can be used in combination with stealth dicing techniques. In stealth dicing, laser radiation is irradiated into a material wherein a focus of the laser radiation is within the material. The material is transparent to this laser radiation. Due to locally high optical power densities at the laser focus, local damage is produced in the material. By scanning the material with the laser focus, damaged regions can be produced specifically within the material. Leakage currents can be reduced by using stealth dicing. This approach is compatible with forming trenches on a back side of the semiconductor laser.

In the semiconductor laser described here, efficient index guidance can be achieved wherein the facets are not affected by dry chemical or wet chemical etching steps. As a result, a low threshold current can be achieved. High differential efficiency and high electro-optical efficiency of the laser diodes are possible. A high yield of the production process can be achieved. An optical far field can be optimized. Device stability is increased and COD's only occur at higher power densities.

Furthermore, towards a carrier, such as a submount, an improved heat dissipation and thus a better facet cooling can be achieved, for example, because lower manufacturing tolerances can be realized when attaching to the carrier and because gaps between the carrier and the semiconductor layer sequence can be made smaller. Tilting of the semiconductor layer sequence relative to the carrier can also be reduced and more precisely controlled.

According to at least one embodiment, the facets are smooth and planar surfaces generated by means of breaking. Due to the breaking, also referred to as cleaving, the facets can be generated with roughnesses in the lower nanometer range. For example, an average roughness of the facets is at most 20 nm or 10 nm or 5 nm, especially in a region of the resonator end faces.

According to at least one embodiment, the facets are rectangular or square or trapezoidal in a plan view on the facets. In particular, the facets comprise no indentations or protrusions in a plan view on the facets.

According to at least one embodiment, the structuring comprises a ridge waveguide. The ridge waveguide is configured to index guide the laser radiation in the resonator. By means of the ridge waveguide, the resonator is defined. In other words, the semiconductor laser is then an index-guided laser.

According to at least one embodiment, the ridge waveguide comprises a broadening towards one facet or, preferably, towards both facets. The at least one broadening preferably extends at the facets over an entire width of the semiconductor layer sequence, in particular at the top side. That is, in a direction perpendicular to a growth direction of the semiconductor layer sequence and in a direction perpendicular to the resonator, the broadenings at the facets extend over the entire semiconductor layer sequence.

According to at least one embodiment, the broadening is rectangular, trapezoidal and/or funnel-shaped when viewed in a plan view of the top side. Funnel-shaped includes in particular that the broadening may comprise curved outer edges as seen in a plan view. Thus, an increase in width of the broadening towards the facets can be continuous and can be described by a differentiable function.

According to at least one embodiment, the broadenings or is the broadening limited to a region directly at the associated facet. Outside the broadening, the ridge waveguide preferably comprises a constant, uniform width. That is, the broadenings at the facets may be the only changes in width of the ridge waveguide.

According to at least one embodiment, a length of the broadening or broadenings is at most 10% or 5% or 3% of a total length of the resonator. That is, along the resonator, the broadenings make up only a small portion of the length. This makes it possible to achieve efficient index guidance despite the broadenings.

According to at least one embodiment, the active zone is not supplied with current or is only weakly supplied with current in a region of the at least one broadening. In particular, the at least one broadening is free of an electrical contact pad and/or free of a current spreading layer. If an electrical contact pad is applied to the at least one broadening, there is preferably an electrically insulating layer between the contact pad and the broadening. By this means, it can be achieved that no or no significant portion of the laser radiation is generated in the active zone in the region of the at least one broadening.

According to at least one embodiment, the semiconductor laser is a gain-guided laser. That is, the laser radiation is guided in the semiconductor layer sequence without refractive index guidance. This refractive index guidance refers to a lateral direction, perpendicular to a resonator axis and perpendicular to a growth direction of the semiconductor layer sequence. A beam path of the laser radiation is then defined by the facets on the one hand and by a region of the semiconductor layer sequence that is supplied with current on the other hand. Preferably, no current is applied to the semiconductor layer sequence directly at the facets.

According to at least one embodiment, the structuring comprises at least two trenches or consists of such trenches. These trenches are configured in particular for reflecting away parasitic laser modes. Viewed in cross-section, such trenches preferably comprise oblique side walls. That is, viewed in cross-section, such trenches may be V-shaped or trapezoidal in shape.

According to at least one embodiment, the trenches extend along the resonator. In particular, the trenches extend parallel to the resonator. However, because the trenches are part of or form the patterning, the trenches do not extend to the facets. For example, a length of the trenches is at least 80% of the total length of the resonator.

According to at least one embodiment, the structuring comprises or consists of one or more H-shaped protrusions in a plan view of the top side. Preferably, a central bar of this H extends along the resonator. The edge legs of the H are preferably located at the facets, as seen in a plan view of the top side.

According to at least one embodiment, the H is asymmetrically shaped as seen in a plan view of the top side. That is, the center bar of the H's, and thus the resonator, are eccentrically located in the top side. The center bar of the H is preferably oriented perpendicular to the facets, again as seen in a plan view of the top side.

According to at least one embodiment, the structuring comprises a frame. The structuring may also consist of the frame. The frame preferably bounds the semiconductor layer sequence on the top side all around. That is, the frame may form circumferential outer edges of the semiconductor layer sequence at the top side.

According to at least one embodiment, a maximum thickness of the semiconductor layer sequence is present at the frame. In this case, a ridge waveguide may have the same thickness as the frame, so that the maximum thickness is not necessarily limited to the frame. Alternatively, it is possible for the frame to comprise a thickness less than that of a ridge waveguide. The maximum thickness may also be present at the H through which the structuring is formed or which comprises the structuring.

According to at least one embodiment, at least one acoustic layer is provided on at least one of the facets on the top side of the semiconductor layer sequence. The acoustic layer preferably comprises a lower sound velocity than the semiconductor layer sequence. For example, the sound velocity when breaking the facets in the acoustic layer is between 20% and 100%, inclusive, or between 50% and 80%, inclusive, of the sound velocity in the semiconductor layer sequence. The at least one acoustic layer enables a more uniform breaking of the facets.

According to at least one embodiment, the acoustic layer is arranged at a distance from electrical contact pads of the semiconductor laser. This applies in particular if the acoustic layer comprises at least one metal layer or consists of at least one metal layer. That is, the acoustic layer then does not perform any electrical function.

According to at least one embodiment, the acoustic layer is limited to a strip at the associated facet. Thus, the acoustic layer can have a rectangular shape when viewed in a plan view. If several acoustic layers are present, these preferably follow one another directly in a direction away from the semiconductor layer sequence and/or can be congruently with one another. The acoustic layer may be applied directly to the semiconductor layer sequence or there is a further layer such as a passivation layer between the acoustic layer and the semiconductor layer sequence. Preferably, however, the acoustic layer is located directly on the semiconductor layer sequence.

According to at least one embodiment, a minimum distance of the optically effective resonator end faces, which are configured for reflection and/or for coupling out of the laser radiation generated in operation, towards a material removal from the semiconductor layer sequence is at least 40 µm or 100 µm or 150 µm or 200 µm. Alternatively or additionally, this distance is at most 150 µm or 200 µm or 0.4 mm. Alternatively or additionally, this distance is at least three times or five times or ten times an average diameter of the resonator end faces. This distance is preferably determined in a plan view of the associated facet. In particular, the minimum distance is between the resonator end face in question and a side surface of the semiconductor layer sequence bounding the associated facet.

The average diameter of the resonator end faces is, for example, greater than or equal to an average mode diameter of the laser radiation at the associated facet. This mode diameter is, for example, the diameter of a smallest possible ellipse at the facet in question within which 95% of the laser power lies in intended operation. This ellipse may be equal to the resonator end faces.

In other words, material removals are far away from the resonator end faces, so that any influence of damage due to the material removals on the resonator end faces is small or negligible. Preferably, the facets are completely free of material removals.

According to at least one embodiment, at least one initiator region is generated at one or more facets and spaced apart from the associated resonator end face. The at least one initiator region is configured as an initial region for breaking the semiconductor layer sequence. Preferably, the initiator region is generated by means of stealth dicing.

With stealth dicing, no or substantially no material is removed from the semiconductor layer sequence. Thus, the initiator region preferably does not represent a removal of material from the semiconductor layer sequence, but only a local destruction of the crystal structure of the semiconductor layer sequence.

According to at least one embodiment, the associated facet at the initiator region is rougher than at the associated resonator end face. The roughness of the initiator region is due to the local destruction of the crystal structure of the semiconductor layer sequence. Preferably, however, the initiator region is as flat and smooth as possible with the lowest possible roughness.

According to at least one embodiment, the semiconductor laser comprises a plurality of resonators. That is, the semiconductor laser may be formed as a laser bar with a plurality of laser units. The laser units may be electrically designed in parallel or in series, or may be electrically operable independently of each other, either individually or in groups.

According to at least one embodiment, the semiconductor laser comprises a carrier. The carrier is different from a growth substrate of the semiconductor layer sequence.

According to at least one embodiment, the carrier comprises a carrier structure. The carrier structure is located on a side of the carrier facing the semiconductor layer sequence and faces the top side. The semiconductor layer sequence is attached to the carrier with the top side, so that the top side faces the carrier.

According to at least one embodiment, the carrier structure corresponds to the structuring of the semiconductor layer sequence or to at least a part of the structuring of the semiconductor layer sequence. For example, the carrier structure and the structuring of the semiconductor layer sequence are congruently in places when viewed in a plan view, particularly at an edge of the top side.

Due to the carrier structure and the structuring of the semiconductor layer sequence, the carrier and the semiconductor layer sequence can be adjusted to each other with increased accuracy. For example, the facets and corresponding side surfaces of the carrier lie in a common plane with a tolerance of at most 5 µm or 3 µm.

Furthermore, a production method for semiconductor lasers is specified. The production method is used to manufacture a laser as described in connection with one or more of the above embodiments. Features of the production method are therefore also disclosed for the semiconductor laser, and vice versa.

In at least one embodiment, the production method comprises the following steps, preferably in the order indicated:
Growing the semiconductor layer sequence,
structuring the semiconductor layer sequence by means of a material removal, so that the at least one geometric structuring is formed, and
generating the facets by means of breaking, wherein the breaking is takes place only in those regions of the semiconductor layer sequence from which no material of the semiconductor layer sequence was previously removed.

According to at least one embodiment, the initiator regions for the breaking are generated by means of laser radiation. In particular, stealth dicing is used to generate the initiator regions.

According to at least one embodiment, the top side and a bottom side of a growth substrate for the semiconductor layer sequence are planar at the facets. In other words, the top side and the bottom side at the facets form straight-line boundary edges.

In the following, a semiconductor laser described herein and a production method described herein are explained in more detail with reference to the drawings by means of exemplary embodiments. Identical reference signs specify identical elements in the individual figures. However, no scaled references are shown; rather, individual elements may be shown in exaggerated size for better understanding.

BRIEF DESCRIPTION OF THE DRAWINGS

In the Figures:
FIG. 1C shows a schematic side view of the semiconductor laser of FIGS. 1A and 1B,
FIGS. 4 and 5 show schematic side views of exemplary embodiments of semiconductor lasers described herein.

DETAILED DESCRIPTION

Figure 1:
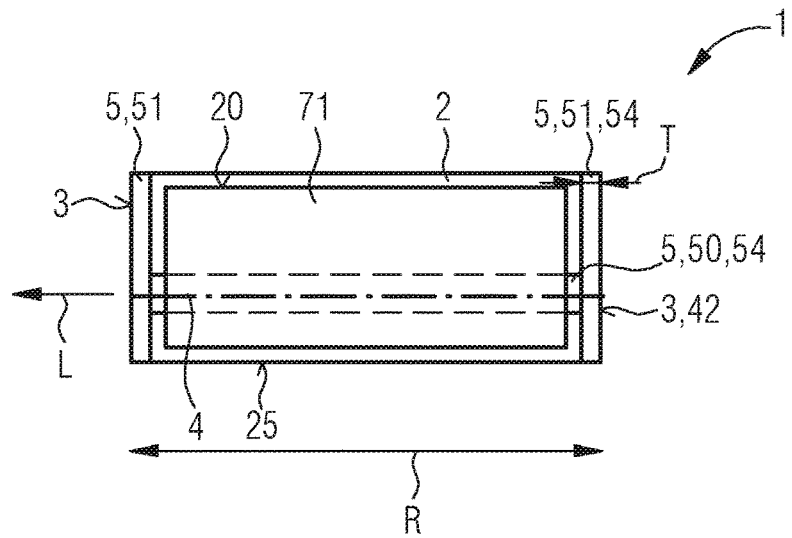
FIGS. 1 to 3 show in each case figure parts A a plan view and in figure parts B a side view of exemplary embodiments of semiconductor lasers described herein.
Figure 1:
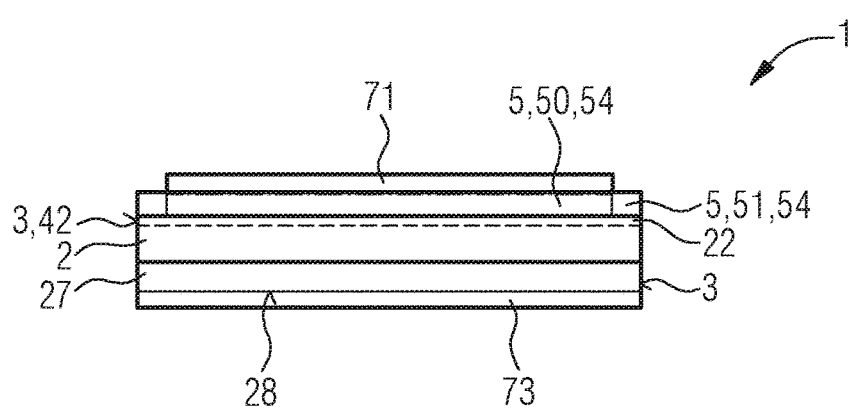
Figure 1:
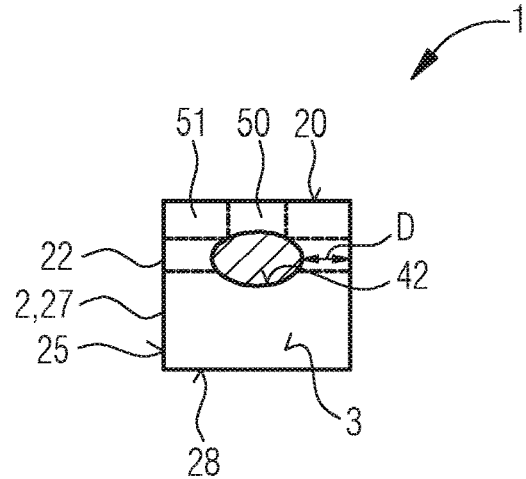

FIG. 1 shows an exemplary embodiment of a semiconductor laser 1. The semiconductor laser 1 comprises a semiconductor layer sequence 2 with an active zone 22 for generating a laser radiation L. Preferably, the semiconductor layer sequence 2 is based on the material system AlInGaN. The semiconductor layer sequence 2 may still be located on a growth substrate 27. For example, the growth substrate 27 is a GaN substrate.

A structuring 5 is formed on a top side 20 of the semiconductor layer sequence 2. The structuring 5 includes a ridge waveguide 50. A resonator 4 is defined by the ridge waveguide 50. Via the ridge waveguide 50, an index guidance of the laser radiation L within the semiconductor layer sequence 2 is performed.

The resonator 4 is bounded in the longitudinal direction by two facets 3 of the semiconductor layer sequence 2. The facets 3 are each planar over the entire surface and are generated by means of breaking. In a plan view on the facets 3, the facets 3 are rectangular.

Each facet 3 includes a resonator end face 42. The resonator end faces 42 are those regions of the facets 3 at which the laser radiation L is reflected at the facets 3 and/or emerges from the facets 3. Thus, the resonator end faces 42 are located in a region of the resonator 4 and the active zone 22 as seen in a plan view of the facets 3, see FIG. 1C. Remaining regions of the facets 3 are optically essentially inactive. Seen in a plan view, the resonator end faces 42 are elliptical or circular, for example.

In order that the facets 3 may be generated over the entire surface in high quality, the ridge waveguide 50 comprises broadenings 51 towards the facets 3 and the resonator end faces 42. The broadenings 51 are rectangular in shape when viewed from above and extend along the top side 20 along the entire facets 3, see FIG. 1A. The ridge waveguide 50 together with the broadenings 51 form an H-shaped protrusion 54, which forms the structuring 5.

Thus, there are no regions at the facets 3 where a material removal of the semiconductor layer sequence 2 has been carried out after a growth. In particular, etchings for the ridge waveguide 50 do not extend to the facet 3.

It is possible that the active zone 22 is located below the ridge waveguide 50. That is, the active zone 22 is preferably not affected by the structuring 5.

Optionally, an electrical contact pad 71 is located extending above the ridge waveguide 50, see in particular FIG. 1B. The electrical contact pad 71 is preferably formed by one or more metallizations. Seen from above, the contact pad 71 can be rectangular in shape. It is possible that the electrical contact pad 71 comprises bulges towards the facets 3 in a region of the ridge waveguide 50. The broadenings 51 are free of the contact pad 71. The contact pad 71 preferably extends on both sides of the ridge waveguide 50 onto the top side 20.

Optionally, a further electrical contact pad 73 is located on a bottom side 28 of the growth substrate 27 facing away from the semiconductor layer sequence 2. Thus, the semiconductor laser 1 is electrically contactable from two opposite main sides.

Seen in a plan view and in the direction perpendicular to the resonator 4, the broadenings 51 preferably extend to at least 200 µm or 100 µm or 50 µm away from the ridge waveguide 50. Thus, side surfaces 25 of the semiconductor laser 1 which extend transversely to the facets 3 are comparatively far away from the ridge waveguide 50. An extension T of the broadenings 51 along the resonator 4 is preferably at least 1 µm or 3 µm. Alternatively or additionally, this extension T of the broadenings 51 is at most 100 µm or 30 µm. Alternatively or additionally, this extension T of the broadenings 51 along the resonator 4 is preferably at most 10% or 5% of a total length R of the resonator 4 in each case. The corresponding applies preferably also in all exemplary embodiments.

In FIG. 1C it is further illustrated that a distance D between the lying ellipse-shaped resonator end face 42 and a material removal or a material processing at the facets 3 and seen in a plan view of the facets 3 is relatively large and preferably at least 100 µm. Thus, material defects in a region of material removal or material processing do not exert a significant influence on the semiconductor material of the resonator end face 42.

Since there is preferably no material removal or material processing on the top side 20, the distance D in this case is measured towards the side surface 25, which is produced, for example, by means of breaking, etching or sawing. Furthermore, it can be seen in FIG. 1C that this distance towards regions of the top side 20 in regions adjacent to the ridge waveguide 50 would be almost zero without the broadening 51, see the dash lines in FIG. 1C illustrating the ridge waveguide 50.

Figure 2:
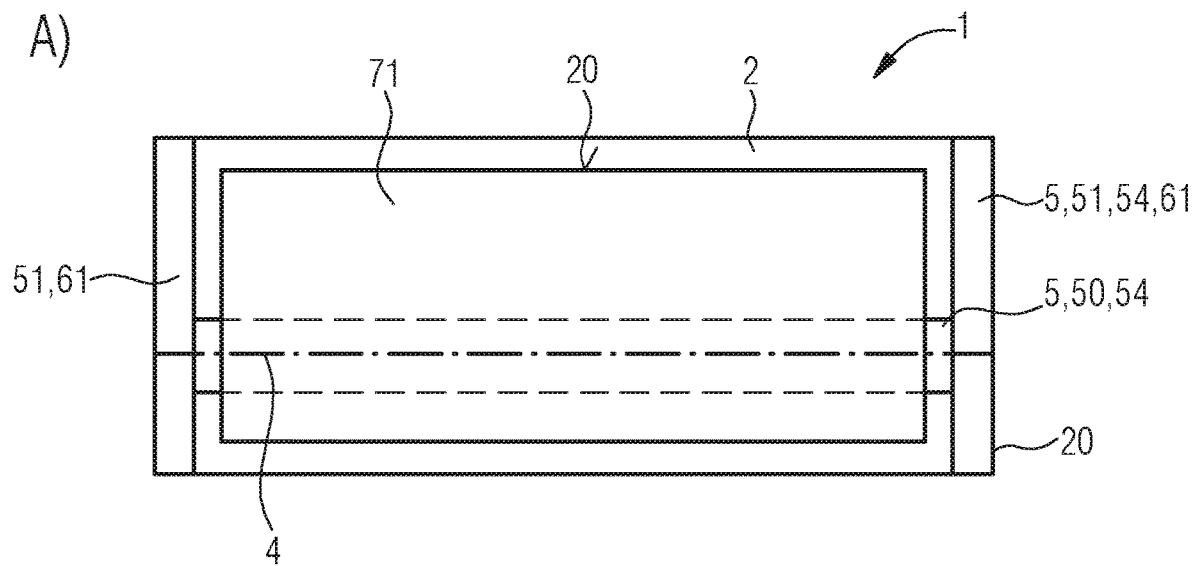
Figure 2:
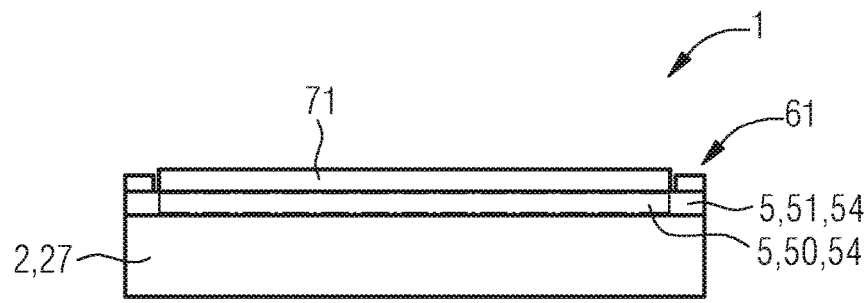

In FIG. 2, it is shown that an acoustic layer 61 is applied along each of the facets 3 on the top side 20 on the broadenings 51. The acoustic layer is used to guide a breaking wave when the facets are broken. The acoustic layer 61 is preferably made of a speed of sound adapted material. For example, the acoustic layer 61 is made of silicon dioxide, $Si_3N_4$, SiON, ZnO, ITO or $Al_2O_3$ or combinations of insulating layers. Furthermore, it is possible that the acoustic layer 61 is of a semiconductor material such as silicon, of an II-VI semiconductor material, or of a III-N semiconductor material. Preferably, the acoustic layer 61 is made of at least one metal such as titanium, palladium, nickel, platinum and/or gold.

A thickness of the acoustic layer 61 is preferably at least 10 nm or 50 nm. Alternatively or additionally, the thickness of the acoustic layer 61 is at most 2 µm or 1 µm. It is possible that in the direction away from the top side 20 the contact pad 71 rises above the acoustic layer 61, as shown in FIG. 2B. Alternatively, the contact pad 71 and the acoustic layer 61 may be flush with each other in the direction away from the top side 20, or the acoustic layer 61 may rise above the contact pad 71.

In all other respects, the statements with respect to FIG. 1 can apply mutatis mutandis to FIG. 2.

Figure 3:
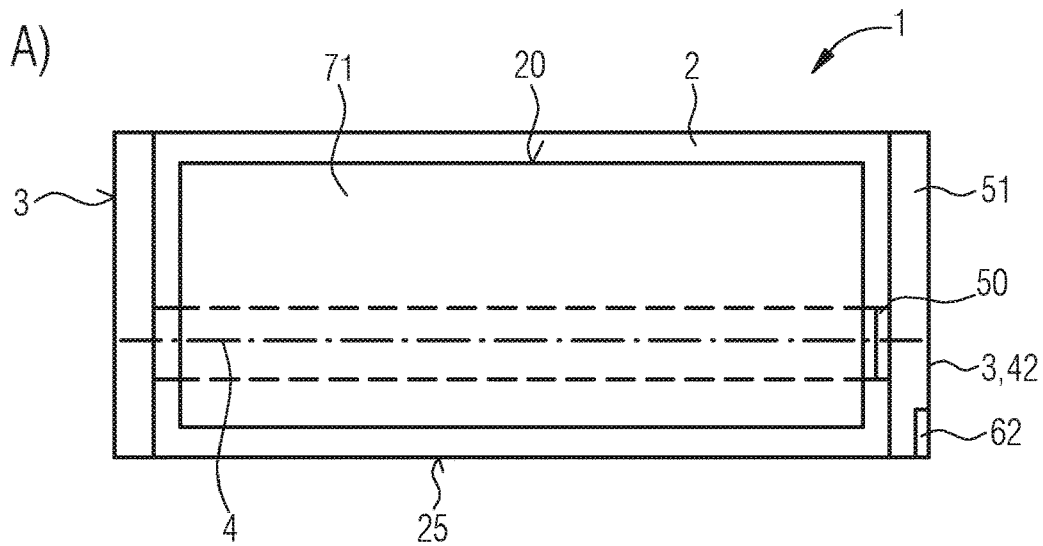

In the exemplary embodiment of FIG. 3, the semiconductor laser 1 additionally comprises an initiator region 62 on each of the facets 3. Starting from the initiator regions 62, the facets 3 are generated by means of breaking. The initiator regions 62 are located, for example, on the surface 20 at ends of the facets 3.

Preferably, the initiator regions 62 are generated via laser radiation by means of stealth dicing, laser scribing or via a diamond scribe. A depth of the initiator regions 62 is preferably at least 100 nm and/or at most 90% of a thickness of the semiconductor layer sequence 2 or a thickness of the semiconductor layer sequence 2 together with the growth substrate 27, not drawn in FIG. 3. An extension of the initiator regions 62 in the direction parallel to the facets 3 is preferably at least 2 µm or 10 µm or 30 µm and/or at most 200 µm or 100 µm.

Such initiator regions 62 may be provided in a wafer composite during fabrication of the semiconductor lasers 1 for each semiconductor laser 1 or may occur only in one semiconductor laser per a certain number of semiconductor lasers, for example, only in every second or every fifth semiconductor laser.

A width of the trenches in the direction parallel to the resonator 4 is preferably relatively small and is for example at least 0.2 µm or 0.5 µm and/or at most 20 µm or 10 µm.

Figure 4:
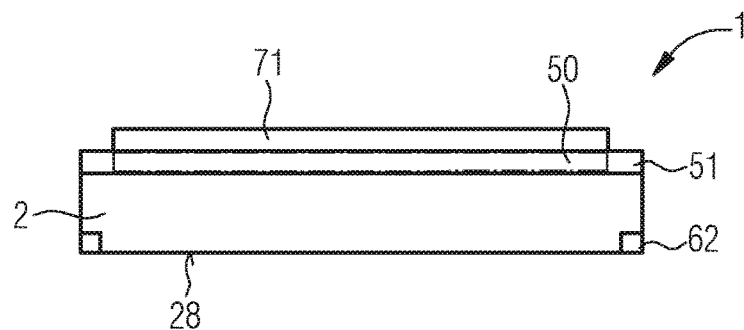
Figure 5:
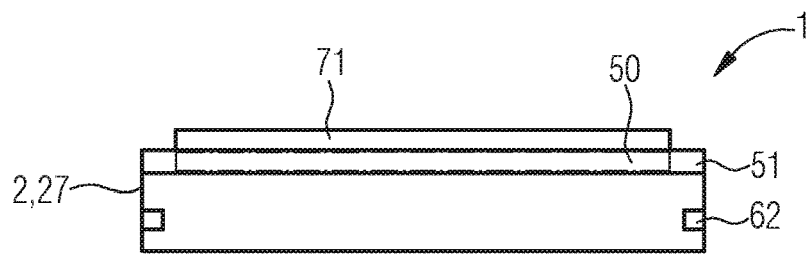

In FIG. 4 it is illustrated that the initiator regions 62 are not located at the top side 20, but at the bottom side 28. In contrast, it is shown in FIG. 5 that the initiator regions 27 are located within the compound of the semiconductor layer sequence 2 and the growth substrate 27. This is made possible in particular by the fact that the initiator regions 62 are created by stealth dicing. The explanations regarding the dimensions of the initiator regions 62, as explained with respect to FIG. 3, apply accordingly to FIGS. 4 and 5.

Such initiator regions 62, as illustrated in connection with FIGS. 3 to 5, may also be present in all other exemplary embodiments.

In FIG. 6A, a wafer composite 10 is illustrated in which several of the semiconductor lasers 1 are still directly adjacent to each other. Along breaking lines 81 the facets 3 are generated. Along singulation lines 82 the semiconductor lasers 1 can be singulated in a direction parallel to the resonators 4. Singulation along singulation lines 82 is, for example, also a breaking, but can also be performed by other methods such as sawing or laser irradiation.

Along line A-A of FIG. 6A, a sectional view is shown in FIG. 6B. It is illustrated that initiator regions 62 are created along the singulation lines 82 using stealth dicing.

The semiconductor lasers 1, as illustrated in FIG. 6B, comprise the ridge waveguide 50. Further, trenches 52 are provided through which parasitic laser modes and/or stray light can be reflected or absorbed away. In addition, see FIG. 6A, a circumferential frame 53 is provided, which bounds the semiconductor lasers 1 at the top side 20 all around. Thus, the breaking lines 81 and the singulation lines 82 extend exclusively through regions of the semiconductor layer sequence 2 from which no material has been removed.

As in all other exemplary embodiments, it is possible for the contact pad 71 to extend over a large area of the semiconductor layer sequence 2. In order to allow only localized current supply of the semiconductor layer sequence 2, a passivation layer 63 is then preferably applied. The passivation layer 63 is, for example, made of an oxide such as silicon oxide and may comprise a thickness, for example, of at least 20 nm and/or of at most 800 nm.

Figure 6:
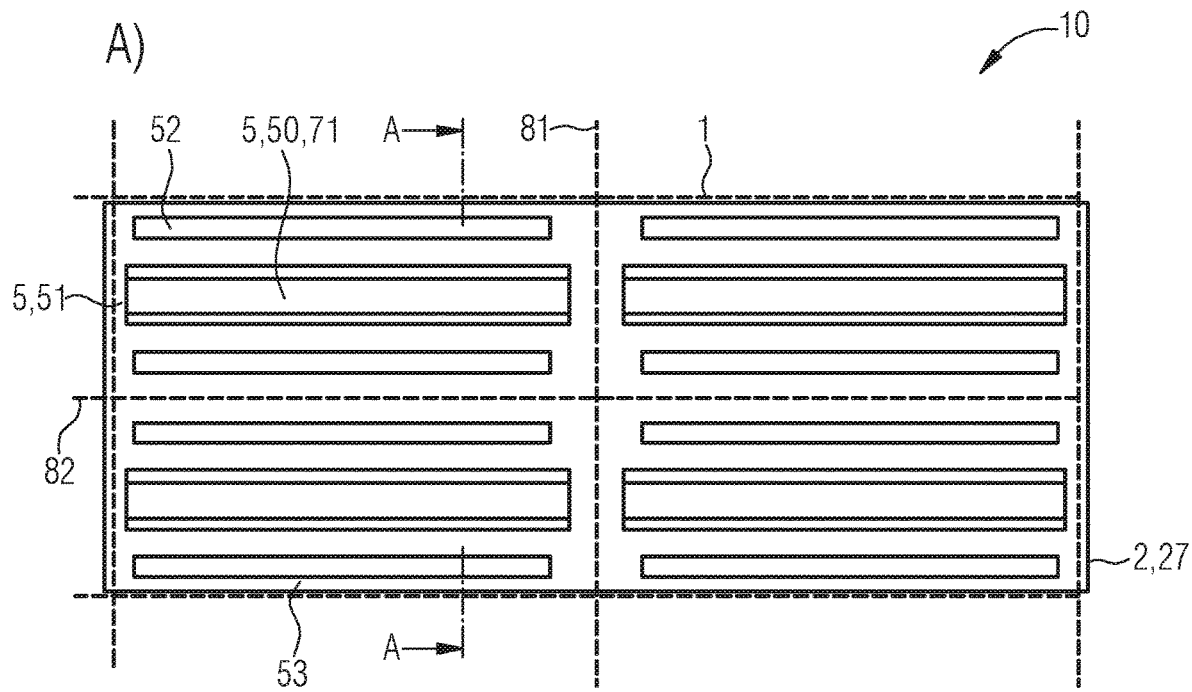
FIG. 6 shows in figure part A a schematic plan view and in the figure part B a schematic sectional view of a method step for production of semiconductor lasers described herein.
Figure 6:
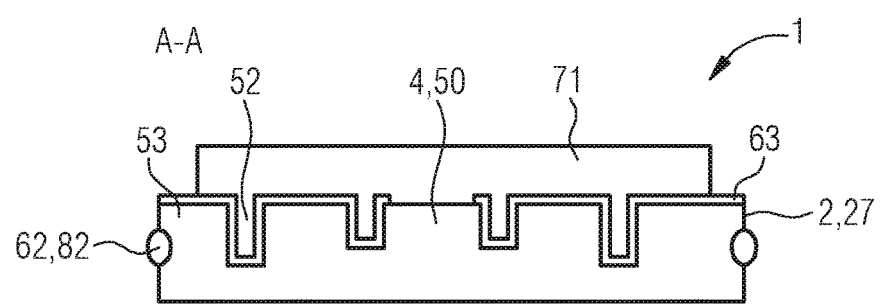

Such additional trenches 52 and a frame 53, as illustrated in FIG. 6, may also be present in all exemplary embodiments.

Figure 7:
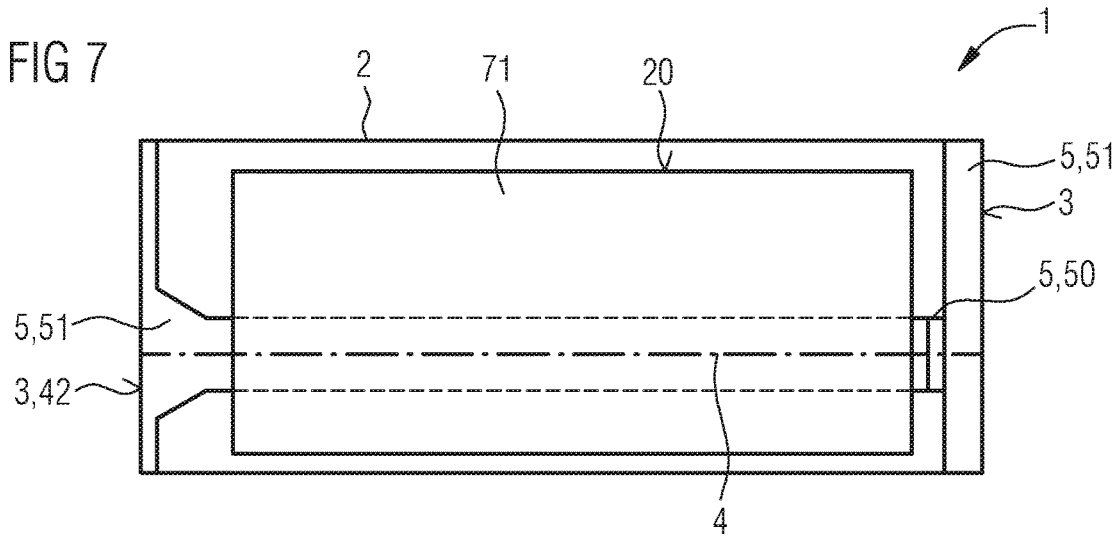
FIGS. 7 and 8 show schematic plan views of exemplary embodiments of semiconductor lasers described herein.

In the exemplary embodiment of the semiconductor laser 1 shown in FIG. 7, a width of the broadening 51 first increases linearly in the direction toward the facet 3 before a sudden increase in the width occurs. The broadening 51 thus comprises a trapezoidal region and a rectangular region, as seen in a plan view of the top side 20. Viewed along the resonator 4, an extension of the trapezoidal region is, for example, at least twice and/or at most ten times the extension of the rectangular region.

By such a geometry of the broadening 51, in particular monomode lasers with a high optical output power can be obtained. Preferably, such broadenings 51 are present on both facets 3, as shown in the left half of FIG. 7. Corresponding broadenings 51 may also be present in all other exemplary embodiments.

A thickness of the broadening 51 in the direction perpendicular to the top side 20 is preferably equal to a thickness of the ridge waveguide 50, but may also comprise a value different therefrom. For example, the ridge waveguide 50 and/or the broadening 51 comprise a thickness of at least 0.2 µm or 0.5 µm or 1 µm and/or of at most 5 µm or 3 µm in a direction away from the active zone 22. A total thickness of the semiconductor layer sequence 2 as grown on growth substrate 27 is for example at least 4 µm and/or at most 12 µm.

Figure 8:
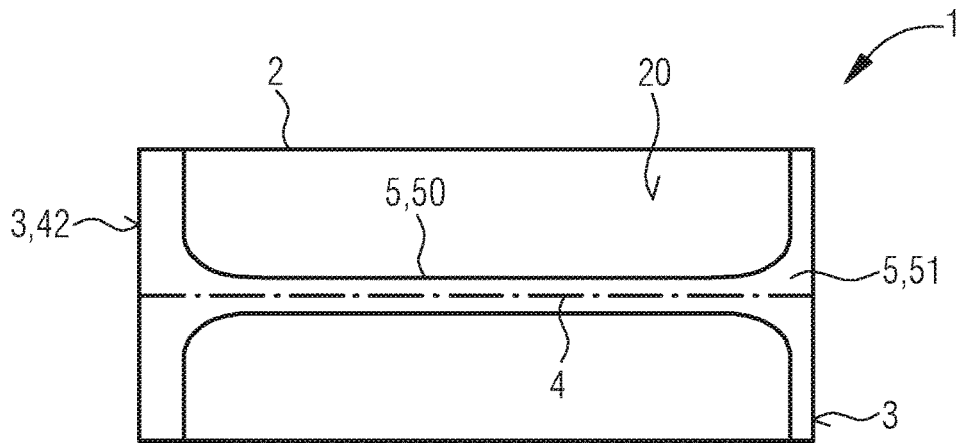

Deviating from FIG. 7, it is illustrated in FIG. 8 that the broadening 51 merges steadily and without kinks into the actual ridge waveguide 50. In all other respects, the statements with respect to FIG. 7 also apply to FIG. 8.

Figure 9:
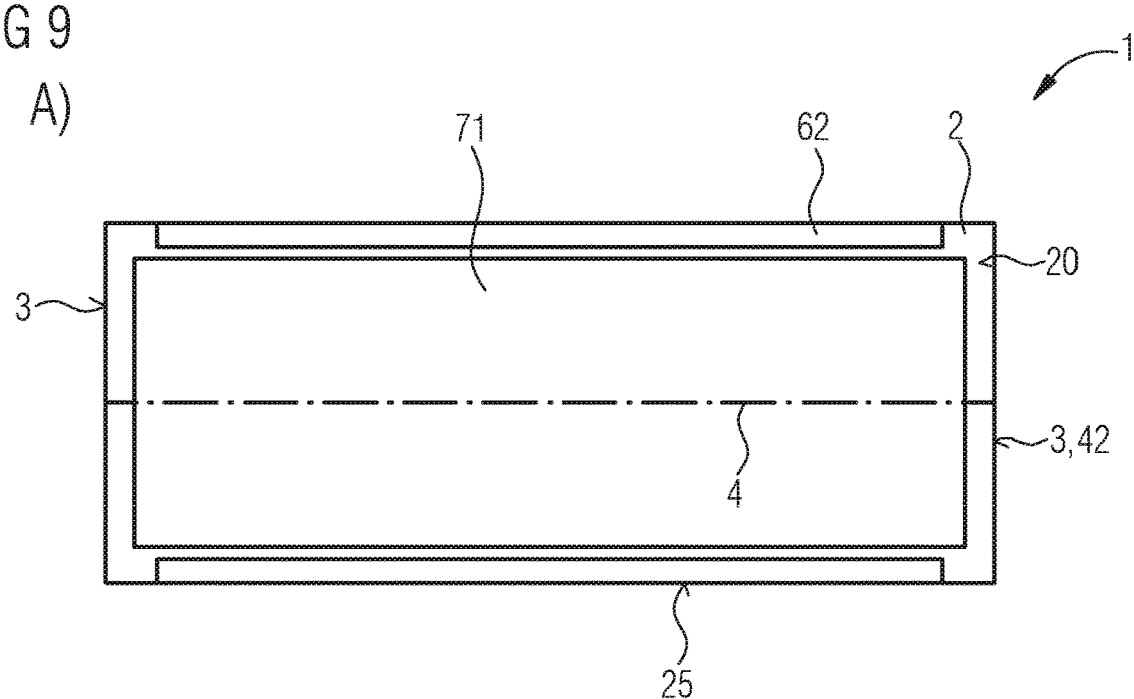
FIG. 9A shows a schematic plan view and FIG. 9B a schematic side view of an exemplary embodiment of a semiconductor laser described herein.
Figure 9:
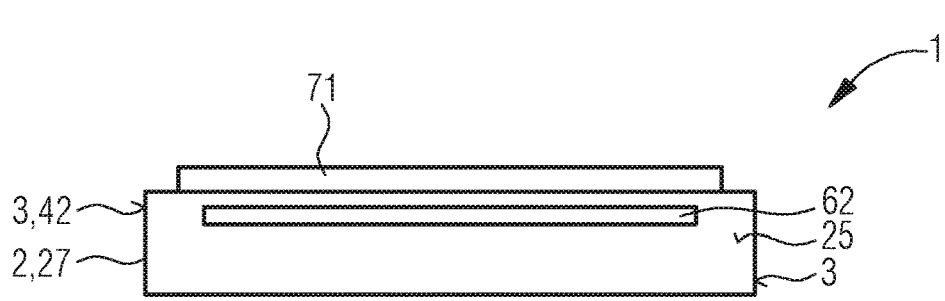

In FIG. 9, in an exemplary embodiment it is shown, that the semiconductor laser 1 is a gain-guided laser. Again, there are no etchings or other material removals extending to the facets 3. Initiator regions 62 may be present on the side surfaces 25 oriented perpendicular to the facets 3, which do not extend to the facets 3 and which may be located in the semiconductor layer sequence 2, together with the growth substrate 27. To avoid parasitic modes, the semiconductor laser 1 of FIG. 9 preferably comprises slopes on the side surfaces 25, not shown, which can form a patterning.

Figure 10:
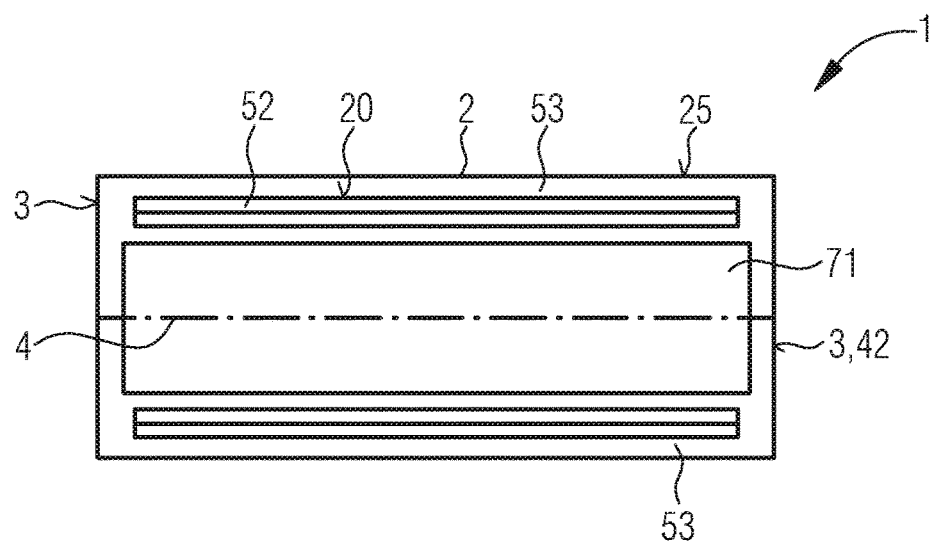
FIG. 10 shows a schematic plan view of an exemplary embodiment of a semiconductor laser described herein.

In FIG. 10, it is illustrated that the gain-guided laser comprises trenches 52 on either side of the resonator 4 within the top side 20. Thus, the circumferential frame 53 is present. The trenches 52 are, for example, V-shaped or trapezoidal in cross-section when viewed perpendicular to the top side 20 and perpendicular to the resonator 4. It is possible for the contact pad 71 to extend closer to the facets 3 than the trenches 52.

Figure 11:
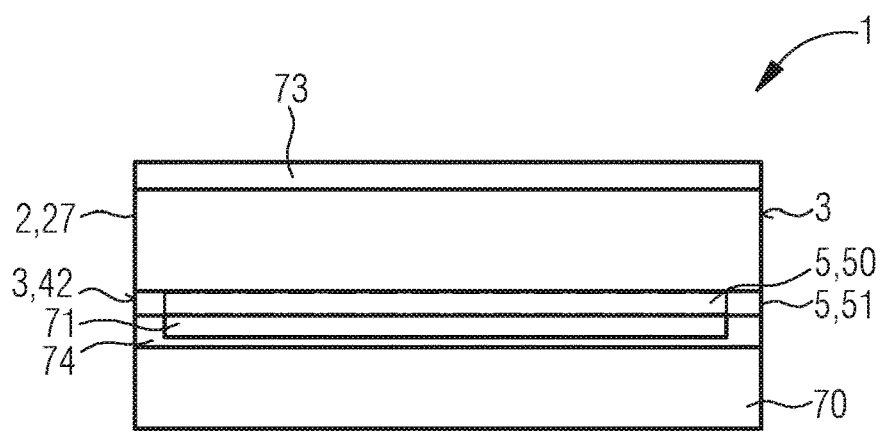
FIGS. 11, 12A and 12B show schematic side views of exemplary embodiments of semiconductor lasers described herein, and
FIG. 13 a schematic plan view of an exemplary embodiment of a semiconductor laser described herein.

In FIG. 11 it is illustrated that the semiconductor laser 1 additionally comprises a carrier 70. The carrier 70 is, for example, a submount and may comprise electrical structures for contacting the semiconductor laser 1. The contact pad 71 is connected to the carrier 70 via a bonding means 74. The bonding means 74 is, for example, a solder. Thus, the top side 20 of the semiconductor layer sequence 2 faces the carrier 70.

Due to the broadening 51 extending along the facets 3, the risk of tilting of the semiconductor layer sequence 2 about an axis of rotation parallel to the resonator 4 is reduced. Thus, the semiconductor layer sequence 2 can be arranged parallel to an upper side of the carrier 70 with high precision.

FIGS. 12A and 12B illustrate a method of attaching the semiconductor layer sequence 2 to the carrier 70. The carrier 70 comprises carrier structures 72, for example in the form of trenches. Alternatively, the carrier structures 72 may be formed by elevations.

FIG. 12B illustrates that, for example, when the contact pad 71 is soldered to the carrier 70, a kind of self-alignment results due to the carrier structure 72. This means that small manufacturing tolerances can be achieved in a direction parallel to the resonator 4. For example, an accuracy with which the facets 3 are flush with side surfaces of the carrier 70 is in the range between 1 µm and 5 µm. If it is not desired for at least one of the facets 3 to be flush with the carrier 70, the carrier structures 72 can also be designed asymmetrically in order to set a specific, desired overhang of the facets 3 over the carrier 70.

Figure 13:
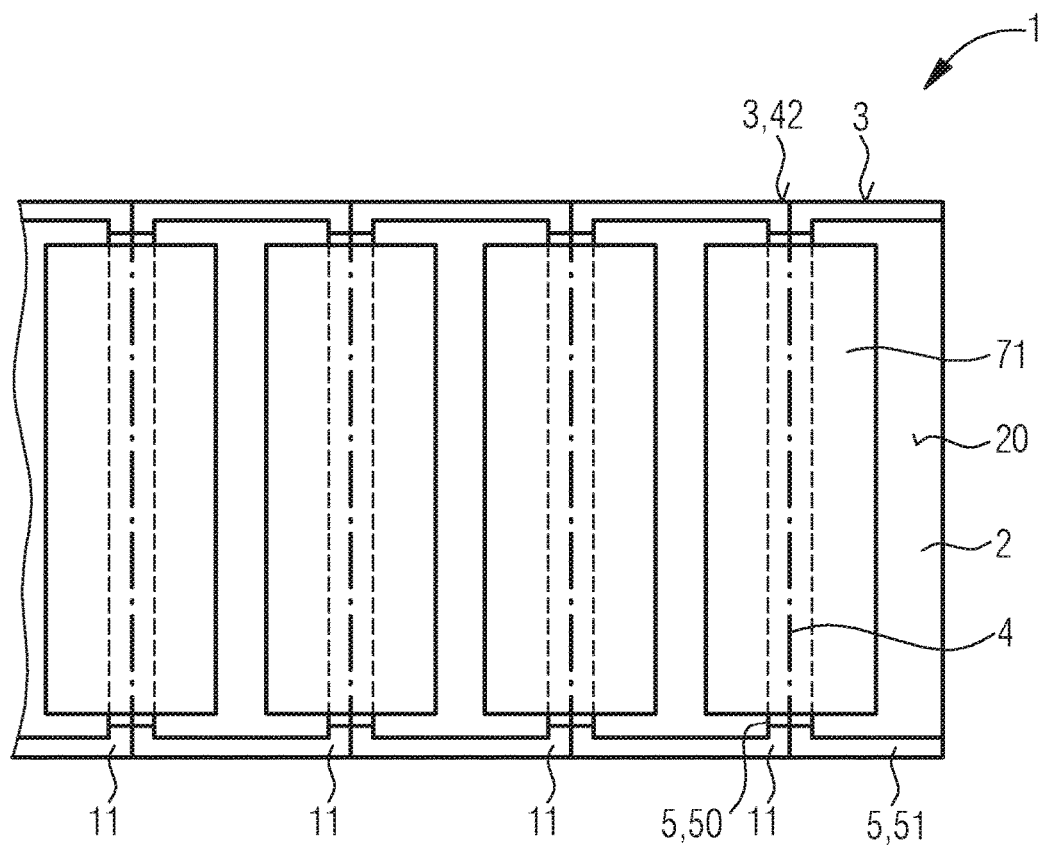

In the exemplary embodiment of FIG. 13, the semiconductor laser 1 is a laser bar. Thus, the semiconductor laser 1 comprises several laser units 11. The laser units 11 may be electrically controllable independently of each other or may be electrically operable together. The broadening 51 preferably extends completely along the facets 3 of the laser bar.

Figure 12:
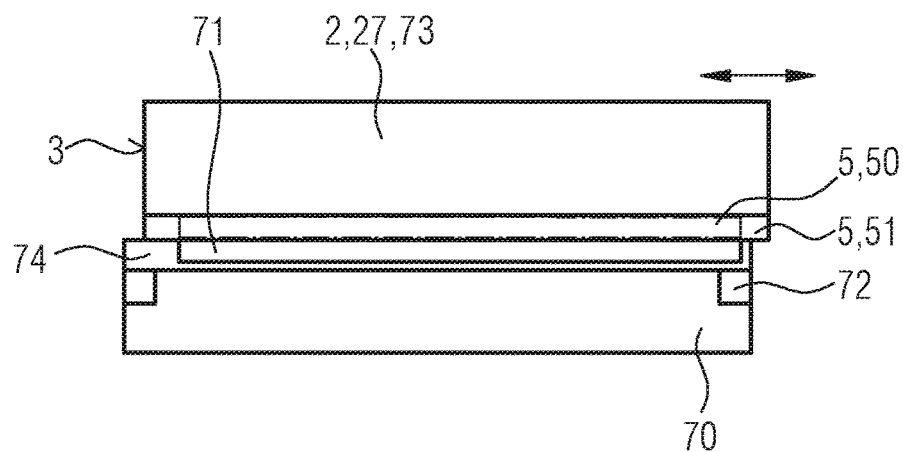
Figure 12:
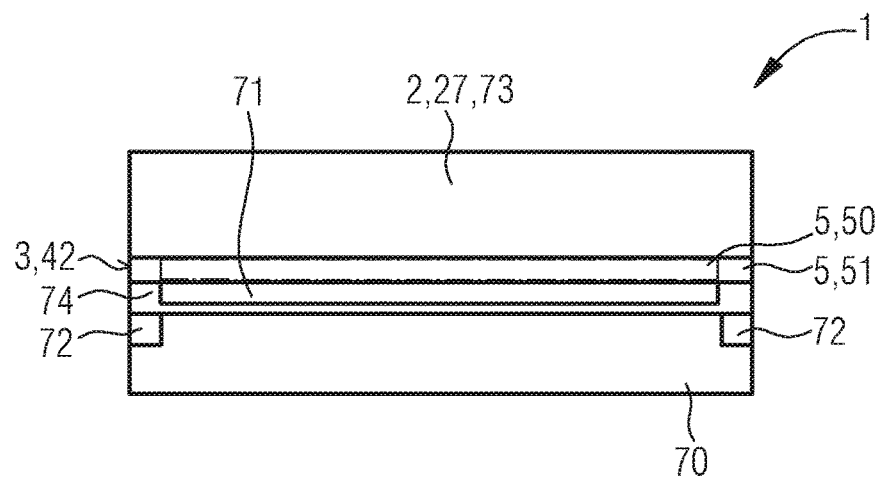

The acoustic layers 61 shown in FIG. 2, the initiator regions 62 of FIGS. 3 to 6, and the broadenings 51 of FIGS. 7 and 8, and also the carriers 70 as shown in FIGS. 11 and 12, may each be present in combination with one another in the exemplary embodiments.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. A semiconductor laser with a semiconductor layer sequence for generating laser radiation, wherein
    the semiconductor layer sequence comprises a geometric structuring on a top side
    a resonator in the semiconductor layer sequence is bounded by two opposing facets of the semiconductor layer sequence, so that the facets comprise resonator end faces,
    an electrical contact pad for electrically contacting the semiconductor layer sequence is located on the top side,
    the geometric structuring ends at a distance from at least one of the facets, and
    at least one of the resonator end faces is spaced apart from an area from which materials are removed;
    an acoustic layer is provided on at least one of the facets on the top side of the semiconductor layer sequence, the acoustic layer is of at least one metal and has a lower sound velocity than the semiconductor layer sequence, and
    the acoustic layer is arranged at a distance from the electrical contact pad and is limited to a strip at an associated facet.

2. The semiconductor laser according to claim 1,
    wherein the facets are planar surfaces produced by means of breaking,
    wherein the facets are rectangular in a plan view on the facets.

3. The semiconductor laser according to claim 1,
in which the geometric structuring comprises a ridge waveguide which comprises a broadening towards each of the facets, so that the semiconductor laser is a refractive index guided laser,
wherein the broadenings at the facets extend over an entire width of the semiconductor layer sequence at the top side.

4. The semiconductor laser according to claim 3,
in which the broadenings are trapezoidal and/or funnel-shaped as seen in a plan view of the top side.

5. The semiconductor laser according to claim 3,
in which each broadening is limited to a region directly at the facets, and the ridge waveguide outside the broadening comprises a constant, uniform width,
wherein a length of each broadening is at most 10% of a length of the resonator.

6. The semiconductor laser according to claim 1,
wherein the semiconductor laser is a gain-guided laser without refractive index guidance.

7. The semiconductor laser according to claim 6,
in which the patterning comprises at least two trenches for reflecting away parasitic laser modes,
wherein the trenches extend along the resonator.

8. The semiconductor laser according to claim 1,
wherein the geometric structuring comprises at least one H-shaped protrusion as seen in a plan view of the top side,
wherein a center bar of said H extends along the resonator.

9. The semiconductor laser according to claim 8,
wherein the H is asymmetrically shaped as seen in a plan view, such that the center bar and the resonator are eccentrically located in the top side.

10. The semiconductor laser according to claim 1,
in which the geometric structuring comprises a frame which bounds the semiconductor layer sequence on the top side all around,
wherein a maximum thickness of the semiconductor layer sequence is present at the frame.

11. The semiconductor laser according to claim 1,
in which, at the facets and as seen in a plan view of the facets, a distance of the optically effective resonator end faces, which are configured for reflection and/or for coupling out the laser radiation generated in operation, towards a material removal out of the semiconductor layer sequence is at least 40 µm and/or at least one fivefold of a mean diameter of the resonator end faces.

12. The semiconductor laser according to claim 1,
wherein an initiator region is generated at at least one of the facets and spaced apart from the associated resonator end face, which initiator region is configured as an initial region for breaking the semiconductor layer sequence,
wherein the said facet comprises a greater roughness at the initiator region than at the associated resonator end face.

13. The semiconductor laser according to claim 1,
which comprises a plurality of resonators, so that the semiconductor laser is a laser bar with a plurality of laser units.

14. The semiconductor laser according to claim 1,
further comprising a carrier with a geometric structure,
wherein the semiconductor layer sequence is attached to the carrier at the top side,
wherein the carrier geometric structure corresponds to the structuring of the semiconductor layer sequence, so that the carrier and the semiconductor layer sequence can be adjusted to each other with a lateral tolerance of at most 5 µm.

15. A production method for semiconductor lasers according to claim 1 comprising the steps:
growing the semiconductor layer sequence,
structuring the semiconductor layer sequence by material removal, so that at least one geometric structuring is formed, and
generating the facets by breaking,
wherein the breaking takes place only in those regions of the semiconductor layer sequence from which no material of the semiconductor layer sequence was previously removed.

16. The method according to claim 15, by which a semiconductor laser comprising an initiator region is produced,
wherein the initiator regions are generated by means of laser irradiation,
such that the top side and a bottom side of a growth substrate for the semiconductor layer sequence are planar at the facets.

17. A semiconductor laser with a semiconductor layer sequence for generating laser radiation, wherein
the semiconductor layer sequence comprises a geometric structuring on a top side
a resonator in the semiconductor layer sequence is bounded by two opposing facets of the semiconductor layer sequence, so that the facets comprise resonator end faces,
an electrical contact pad for electrically contacting the semiconductor layer sequence is located on the top side,
the geometric structuring ends at a distance from at least one of the facets,
at least one of the resonator end faces is spaced apart from an area from which materials are removed, and
an acoustic layer comprising titanium, palladium, nickel, platinum, gold, or a combination thereof is provided on at least one of the facets on the top side of the semiconductor layer sequence, wherein the acoustic layer has a lower sound velocity than the semiconductor layer sequence, and
the acoustic layer is arranged at a distance from the electrical contact pad, directly on the top side of the semiconductor layer sequence, performs no electrical function and is limited to a strip at the associated facet,
the acoustic layer is from 50 nm to 2 microns, and
the contact pad rises above the acoustic layer in a direction away from the top side.

* * * * *